(12) United States Patent
Ying

(10) Patent No.: US 7,275,227 B1
(45) Date of Patent: Sep. 25, 2007

(54) METHOD OF CHECKING OPTICAL PROXIMITY CORRECTION DATA

(75) Inventor: ChangSheng Ying, San Jose, CA (US)

(73) Assignee: Anchor Semiconductor Inc., Sunnyvale, CA (US)

( * ) Notice: Subject to any disclaimer, the term of this patent is extended or adjusted under 35 U.S.C. 154(b) by 0 days.

(21) Appl. No.: 10/711,153

(22) Filed: Aug. 27, 2004

Related U.S. Application Data

(60) Provisional application No. 60/498,424, filed on Aug. 27, 2003.

(51) Int. Cl.
*G06F 17/50* (2006.01)

(52) U.S. Cl. .......................................................... 716/5

(58) Field of Classification Search .............. 716/1–18, 716/5; 703/14–16; 430/5, 30
See application file for complete search history.

(56) References Cited

U.S. PATENT DOCUMENTS

| | | | | |
|---|---|---|---|---|
| 5,182,718 | A | 1/1993 | Harafugi et al. | 716/21 |
| 5,705,301 | A | 1/1998 | Garza et al. | 430/5 |
| 5,858,580 | A | 1/1999 | Wang et al. | 430/5 |
| 5,900,338 | A * | 5/1999 | Garza et al. | 430/5 |
| 5,994,009 | A | 11/1999 | Tzu et al. | 430/30 |
| 6,189,136 | B1 | 2/2001 | Bothra | 716/21 |
| 6,269,472 | B1 * | 7/2001 | Garza et al. | 716/21 |
| 6,282,696 | B1 | 8/2001 | Garza et al. | 716/19 |
| 6,370,679 | B1 | 4/2002 | Chang et al. | 716/19 |
| 6,453,452 | B1 | 9/2002 | Chang et al. | 716/8 |
| 6,453,457 | B1 | 9/2002 | Pierrat et al. | 716/19 |
| 6,466,314 | B1 * | 10/2002 | Lehman | 356/237.1 |
| 6,470,489 | B1 | 10/2002 | Chang et al. | 716/21 |
| 6,503,666 | B1 | 1/2003 | Pierrat | 430/5 |
| 6,505,327 | B2 | 1/2003 | Lin | 716/5 |
| 6,523,162 | B1 | 2/2003 | Agrawal et al. | 716/19 |
| 6,523,165 | B2 | 2/2003 | Liu et al. | 716/21 |
| 6,524,752 | B1 | 2/2003 | Pierrat | 430/5 |
| 6,539,521 | B1 | 3/2003 | Pierrat et al. | 716/4 |
| 6,794,096 | B2 * | 9/2004 | Kroyan | 430/5 |
| 6,836,560 | B2 * | 12/2004 | Emery | 382/145 |
| 6,999,611 | B1 * | 2/2006 | Lopez et al. | 382/144 |
| 7,079,235 | B2 * | 7/2006 | Lehman | 356/237.1 |
| 7,221,788 | B2 * | 5/2007 | Schulze et al. | 382/144 |
| 2002/0131052 | A1 * | 9/2002 | Emery | 356/511 |
| 2003/0086081 | A1 * | 5/2003 | Lehman | 356/237.1 |
| 2004/0019869 | A1 * | 1/2004 | Zhang | 716/11 |
| 2005/0002554 | A1 * | 1/2005 | Schulze et al. | 382/144 |
| 2005/0111727 | A1 * | 5/2005 | Emery | 382/145 |

* cited by examiner

*Primary Examiner*—Jack Chiang
*Assistant Examiner*—Suchin Parihar
(74) *Attorney, Agent, or Firm*—Townsend & Townsend & Crew LLP

(57) ABSTRACT

A method of inspecting full-chip mask data to locate layout pattern design induced defects and weak points that cause functional failure or performance degradation for integrated circuits (ICs) manufactured in subwavelength technology. Given the pre-OPC integrated circuit design layout data, the method of present invention refers to available post-OPC data or generates post-OPC data condition to do the inspection based on the modeling of integrated circuit wafer patterning. Build-in direct checks of specified electrical functional defects and a multilayer pattern-centric approach are used to improve the accuracy and performance. A technique of adaptive search is used to speed up the critical dimension search during the process of optical proximity correction data verification. A defect synthesis capability is supplied for defect disposition to facilitate systematic correction and prevention of the defects in integrated circuit layout design.

12 Claims, 18 Drawing Sheets

Overall flowchart

METHOD OF CHECKING OPTICAL PROXIMITY CORRECTION DATA

This application claims the benefit of U.S. provisional patent application 60/498,424, filed Aug. 27, 2003, which is incorporated by reference.

BACKGROUND OF THE INVENTION

The present invention relates to the field of electronic design automation (EDA) software, and more specifically, to techniques of checking and verifying the quality of optical proximity correction (OPC) data for an integrated circuit design.

Integrated circuit technology is a marvel of the modern age. Integrated circuits are used in many applications such as computers, consumer electronics, networking, and telecommunications. There are many types of integrated circuits including microprocessors, microcontrollers, application specific integrated circuits (ASICs), gate arrays, programmable logic devices (PLDs), field programmable gate arrays (FPGAs), dynamic random access memories (DRAMs), static random access memories (SRAMs), erasable programmable read only memories (EPROMs), electrically erasable programmable read only memories (EEPROMs), and Flash memories. Integrated circuits (ICs) are also sometimes referred to as "chips."

Integrated circuit technology continues to rapidly advance. As feature sizes become smaller and smaller, the process window gets narrower, and the design rule complexity increases. Optical and other processing effects become more pronounced and dramatically reduce the yield of good dies per wafer. Layout feature induced yield loss is becoming a dominant factor in 0.18 micron and smaller technology (such as 0.15, 0.13, and 0.09 micron technologies) in subwavelength designs.

Optical proximity effects cause defects such as transistor poly pull-back, channel length shortening and nonuniformity, pattern scum, low contrast, and other processing problems. Because of these optical proximity effects, the patterns drawn on a mask are not what results on the wafer after processing: in other words, what you see is not what you get. In order to increase the yield, one approach to address the problem is to use shorter wavelength light, such as X-rays, for lithography. However, it may be some years before X-ray lithography becomes production ready. Another approach is to adjust the mask data to compensate for the proximity effects using an optical proximity correction treatment. Optical proximity correction is a technique of predistorting layout mask patterns such that the printed silicon patterns are as close to the desired shapes as possible. Optical proximity correction treatment is typically done by a foundry on the mask data using optical proximity correction tools from some EDA software vendors.

However optical proximity correction treatment cannot guarantee the one hundred percent correctness of layout shape distortion due to some correction constraints. For example, there are mask-making constraints. Mask-making is a mechanical process and has limits in space or distance control, or both. Also a generic optical proximity correction treatment may not correct some design specific patterns. Manual involvement in optical proximity correction is needed in this case to further improve the production yield. Therefore optical proximity correction treatment result (also referred as optical proximity correction data in the following discussion) verification is needed. The verification report can be used either to guide the local refinement by the optical proximity correction treatment process or to guide the layout design refinement.

In this patent application, the integrated circuit layout design data before optical proximity correction treatment is referred to as pre-optical proximity correction data and the layout data after optical proximity correction treatment is referred to as post-optical proximity correction data. Both pre-optical proximity correction data and post-optical proximity correction data are represented in the industry standard GDSII format.

It is important to provide automation tools to simplify and expedite the task of addressing the proximity effects problem. It is desirable to evaluate and check optical proximity correction data to identify vulnerable layout drawing patterns of a design. It is important that the automation tool provide accurate and fast results, especially when operating on a full-chip scale. As can be seen, techniques are needed to inspect and verify the quality of optical proximity correction data of an integrated circuit.

SUMMARY OF THE INVENTION

The invention is a method of inspecting integrated circuit (IC) full-chip layout data to locate layout pattern induced defects and weak points that cause functional failure or performance degradation for integrated circuits manufactures in subwavelength technology. The embodiment of the invention is a computer program that contains at least the following innovations. Starting from pre-OPC layout data, the program refers to available post-OPC layout data or generates post-OPC data condition to do the inspection based on the modeling of integrated circuit wafer patterning. Build-in direct checks of specified electrical functional defects and a multilayer pattern-centric approach are used to improve the accuracy and performance of optical proximity correction data verification. A technique of adaptive search is also used to speed up the process of optical proximity correction data verification. A defect synthesis capability is supplied for defect disposition to facilitate systematic correction and prevention of the defects in integrated circuit layout design.

In an embodiment, the invention is a software program known as NanoScope™. NanoScope a trademark of Anchor Semiconductor, Inc. This software is a powerful premasking layout verification software tool for yield enhancement. As technology advances to 0.18 microns and smaller, integrated circuit feature size becomes smaller than photolithography wavelength, chip fabrication process becomes so complex that conventional design rules and optical proximity correction (OPC) cannot adequately manage the new challenges. A new suite of tools that is specifically designed for the new technologies is needed to extend the lifetime of current design style and fabrication process.

In an embodiment, the invention is contained in software that predicts how an integrated circuit design will be printed on silicon by accurately simulating fabrication process conditions that affect pattern printing. The software informs a user whether the design has potential downstream defects during chip fabrication process. The software pinpoints the locations of potential real pattern defects in the layout design, and guides physical layout designers to correct the problems before tape-out or making photo masks.

The software inspects any one or combination of the following problems, which can severely affect your chip yield: (1) end-cap shortening, (2) gate length shortening, (3) gate length nonuniformity, (4) open circuits, (5) short circuits, (6) via and metal overlay violation, (7) layer misalignment, or (8) optical proximity correction anomaly. There may be other problems the rules of the software will be able to inspect for that are not specifically enumerated here.

At subwavelength lithography, the wall that traditionally exists between design and manufacturing is disappearing. Engineers need to address manufacturing issues at design phase to ensure your chip time-to-market and reduce total manufacturing cost. The software provides a mission-critical solution in the new era of chip design and manufacturing.

In an embodiment, the invention is a method including providing a first layout database of an integrated circuit design, wherein the first layout database is obtained before optical proximity correction treatment; providing a second layout database of the integrated circuit design, wherein the second database is obtained after optical proximity correction treatment; finding a location of a first structure in the first layout database; finding the first structure in the second layout database based on its location in the first layout database; simulating a resulting layout output for the first structure using the second layout database; measuring a first critical dimension of the first structure from the resulting layout output for the first structure; comparing the first critical dimension of the first structure to a drawn dimension of the first structure from the first database; and flagging the first structure in the first database or the second database, or both, if the first critical dimension is less than the first drawn dimension in the first database.

The first and second layout databases may be in GDSII format. The first structure may be at least one of a transistor gate, transistor end-cap, line, line-end, via and gap, or contact and gap. The step of finding a location of a first structure in the first layout database may be performed using pattern recognition. When the first structure is a transistor gate, the first critical dimension may be a gate length. When the first structure is a transistor gate, the first critical dimension may be a gate width. The method of the invention may further include building a model of a process, to be used to fabricate the integrated circuit design, and where the step of simulating a resulting layout output for the first structure using the second layout database is performed using this model of the process. The step of simulating a resulting layout output for the first structure using the second layout database comprises consulting a look-up table data structure.

In a further embodiment, the step of flagging the first structure in the first or second database, or both, if the first dimension is less than the first drawn dimension in the first database may be replaced by flagging the first structure in the second database if the first dimension is less than the first drawn dimension plus a tolerance value in the first database. The tolerance value may be defined by a user.

In another embodiment, the invention is a method executing in a computer-aided design system for designing circuitry prior to physical implementation, where the method checks compliance of a simulated layout output of a selected structure provided in a first database of a integrated circuit design after optical proximity correction treatment to a drawn dimension the selected structure provided in a second database of the integrated circuit design before optical proximity correction treatment. The method includes providing a design rule that is violated when a measured critical dimension of the simulated layout output for the selected structure is less than the drawn dimension of the selected structure; applying the design rule to at least a portion of the integrated circuit design; and providing a user-discernable indication of any violation of the design rule.

The selected structure may be at least one of a transistor gate, transistor end-cap, line, line-end, via and gap, or contact and gap. The step of providing a design rule that is violated when a measured critical dimension of the simulated layout output for the selected structure is less than the drawn dimension of the selected structure may be replaced by the step of providing a design rule that is violated when a measured critical dimension of the simulated layout output for the selected structure is less than the drawn dimension of the selected structure plus a tolerance value. The tolerance value may be specified by a user.

Other objects, features, and advantages of the present invention will become apparent upon consideration of the following detailed description and the accompanying drawings, in which like reference designations represent like features throughout the figures.

DETAILED DESCRIPTION

Figure 1:
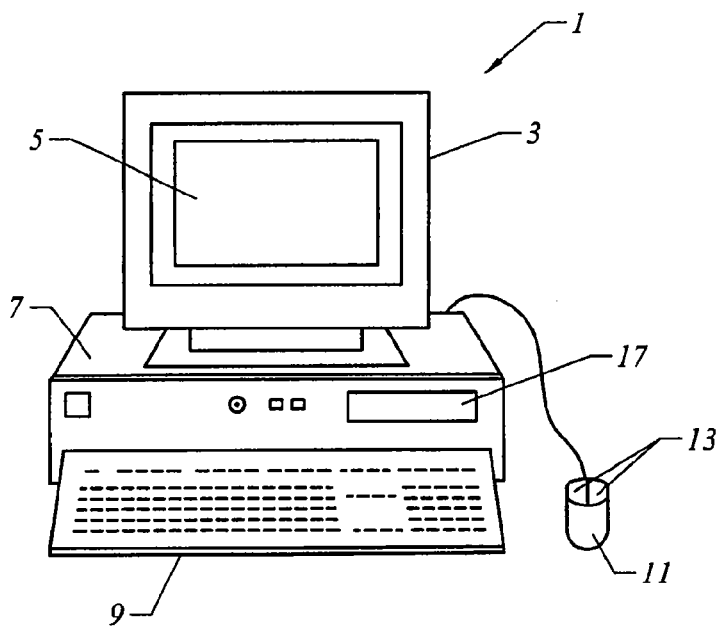
FIG. 1 shows a system of the present invention of checking optical proximity correction data of an integrated circuit design.

FIG. 1 shows a system of the present invention for estimating the performance of an integrated circuit. FIG. 1 may comprise a computer or digital system used to execute the software of the present invention. For example, the method of the present invention may be performed using a computer workstation. FIG. 1 shows a computer system 1 that includes a monitor 3, screen 5, cabinet 7, keyboard 9, and mouse 11. Mouse 11 may have one or more buttons such as mouse buttons 13. Cabinet 7 houses familiar computer components, some of which are not shown, such as a processor, memory, mass storage devices 17, and the like.

Mass storage devices 17 may include mass disk drives, floppy disks, Iomega® ZIP™ disks, magnetic disks, fixed disks, hard disks, Flash disks and storage, CD-ROMs, recordable CDs, DVDs, tape storage, reader, and other similar media, and combinations of these. A binary, machine-executable version, of the software of the present invention may be stored or reside on mass storage devices 17. Furthermore, the source code of the software of the present invention may also be stored or reside on mass storage devices 17 (e.g., magnetic disk, tape, or CD-ROM).

Figure 2:
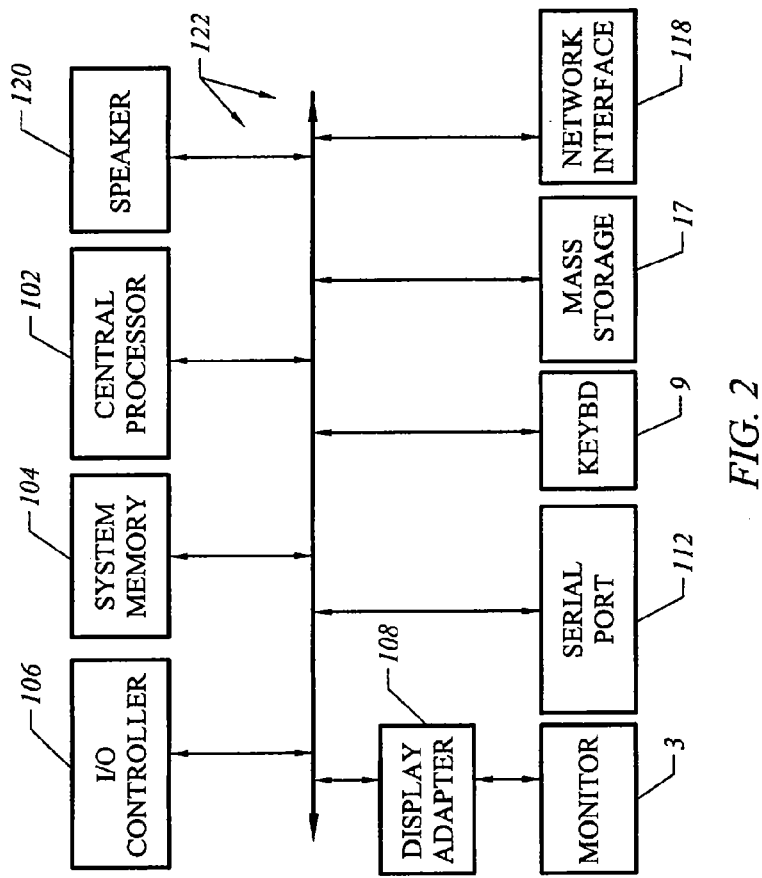
FIG. 2 shows a system block diagram of a computer system used to execute the software of the present invention.

FIG. 2 shows a system block diagram of computer system 1 used to execute the software of the present invention. As in FIG. 1, computer system 1 includes monitor 3, keyboard 9, and mass storage devices 17. Computer system 1 further includes subsystems such as central processor 102, system memory 104, input/output (I/O) controller 106, display adapter 108, serial port 112, network interface 118, and speaker 120. The invention may also be use with computer systems with additional or fewer subsystems. For example, a computer system could include more than one processor 102 (i.e., a multiprocessor system) or a system may include a cache memory.

Arrows such as 122 represent the system bus architecture of computer system 1. However, these arrows are illustrative of any interconnection scheme serving to link the subsystems. For example, speaker 120 could be connected to the other subsystems through a port or have an internal direct connection to central processor 102. Computer system 1 shown in FIG. 2 is but an example of a computer system suitable for use with the present invention. Other configurations of subsystems suitable for use with the present invention will be readily apparent to one of ordinary skill in the art.

A system including a computer or other programmed machine executing electronic design automation (EDA) or computer aided design (CAD) software is used in the design and manufacture of integrated circuits. Electronic design automation A software tools include schematic editors, performance estimation software, circuit simulators, layout editors, design rule checkers, parasitic extractors, optical rule checkers, optical proximity correction (OPC) tools, and many others.

In a preferred embodiment, the techniques of the present invention are implemented in an electronic design automation software program and executed on a computer. The software of the present invention provides a method of checking optical proximity correction data that can be applied on a full-chip basis. The software may be stored on a mass storage device such as a disk drive or other computer readable medium, and then loaded (partially or entirely) into the memory of the computer for execution.

Figure 3:
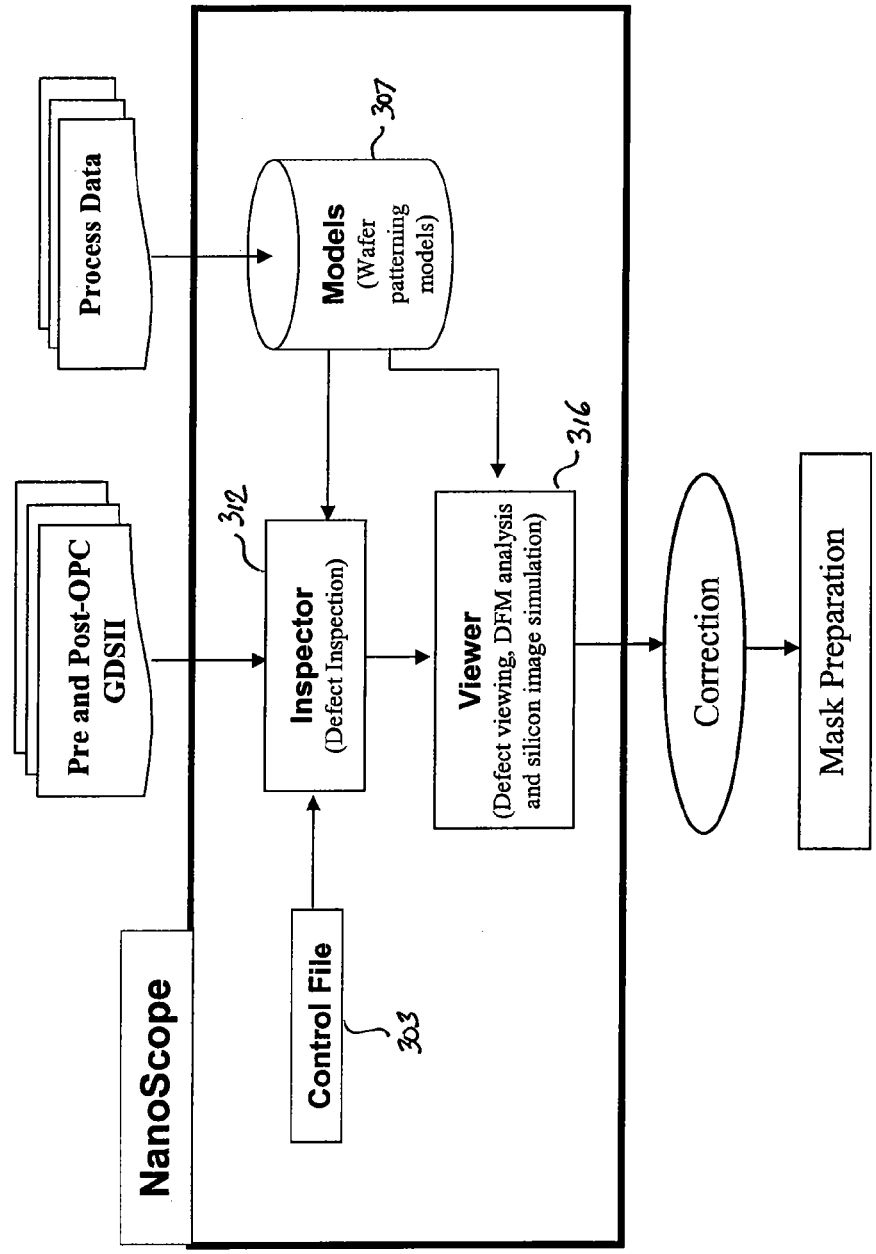
FIG. 3 shows an overall block diagram of a system to check optical proximity correction data.

FIG. 3 shows an overview of the software system architecture of the present invention for checking optical proximity correction data of an integrated circuit design. An embodiment of the invention is the NanoScope™ software, manufactured by Anchor Semiconductor, Inc. This software has four major components: data input 303 (from a control file), modeler 307, inspector 312, and viewer 316. The input to the system includes: (a) process data for process simulation model creation, (b) integrated circuit design layout data for inspection, and (c) a control file describes the targeted layout structures to be checked and their design specification.

The data input component reads the input data prepared by end users and transforms the input data into internal data representation formats in memory designed for other components. The component modeler creates a numerical simulation model to simulate the integrated circuit wafer patterning process. The component inspector uses the simulation model to selectively simulate layout structure's wafer image and reports the structures with design specification violation (also referred to as defect).

The component viewer provides users a user-friendly graphical interface to browse the design data, view pre-OPC and post-OPC layout structures, view defect structures reported by the inspector, and so forth. More detailed explanation for each component follows.

Figure 4:
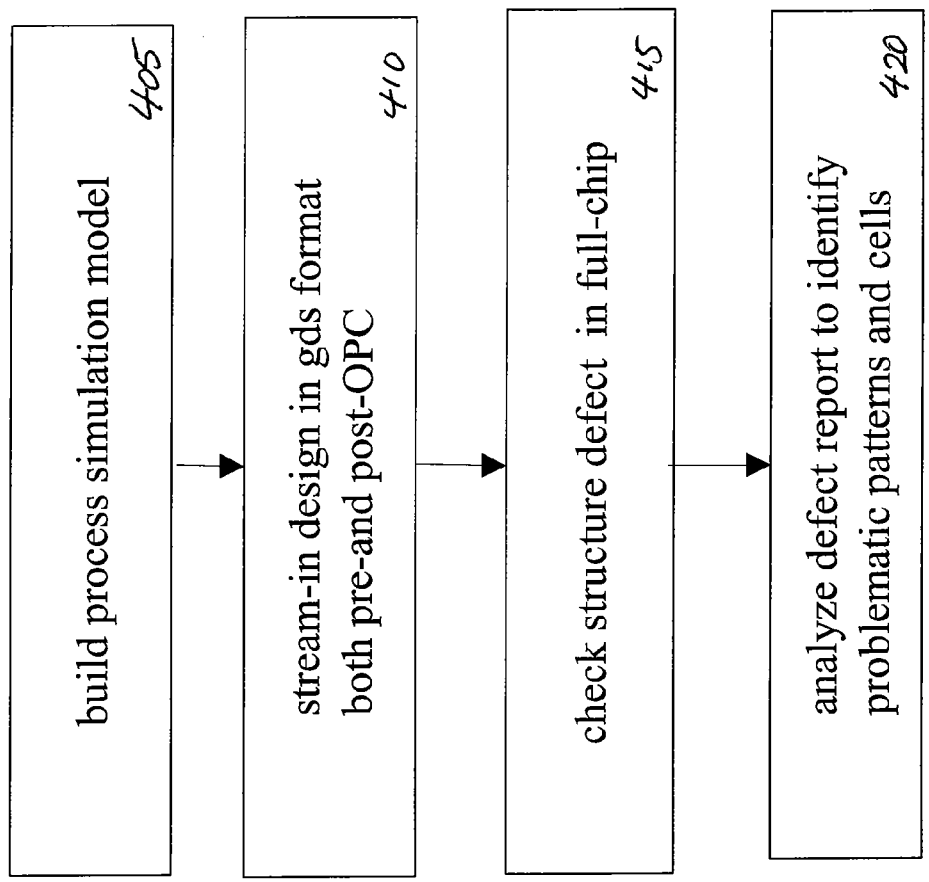
FIG. 4 shows an overall flow diagram for a method checking optical proximity correction data.

FIG. 4 shows a typical work flow chart of an embodiment of the software system. In step 405, build process simulation models. Based on the physics of optical imaging, a numerical computational model is designed to compute the image of layout patterns in wafer. The input of this step includes: (a) the optical lithography conditions including mask technology, photoresist setting, illumination mode, and mask bias; and (b) sample layout patterns (also referred as test pattern) and their wafer image measurement data.

In a specific embodiment, the result of process simulation model is a large look-up table. A look-up table format is used because this facilitates faster simulation of an image. With such a look-up table, given any layout mask pattern and its environment (adjacent patterns) its wafer image can be calculated quickly. The simulation model is needed for each layout mask layer in interest. Usually users want to check the important mask layers like polysilicon and metals. Models for polysilicon and metals are needed.

In step 410, the method takes design data to perform its analysis. This data describes a design layout, which is typically in GDSII format. Both pre-OPC and post-OPC data are needed.

In step 415, the method scans full chip on a window basis to simulate the layout wafer image selectively using the models created in step 405 and checks for each layout structure specified by the user as to whether the design specification is met. The method reports the location and scope for each design specification violation.

One technique to check optical proximity correction data is to use an edge-based approach. This edge-based approach simulates the printed image of all edges in the post-OPC layout database and reports users the edge displacement (or edge shift) error in comparison with the edges' drawn position. This is a straightforward approach for the optical proximity correction treatment and is usually targeted for minimal distortion between drawn layout and the printed layout. However, this approach does not distinguish between edges and typically results in too many useless checks. Consequently, it might be prohibitive slow for the ever-increasing layout complexities.

For example, one layer of a layout may include a very large number of edges such as 1 giga or more. This may be many gigabytes of layout data. Moreover, it is hard for users to extract meaningful result from its checking report because the impact of edge shift is different from place to place and from layout structure to layout structure. Also there is no direct link between edge shift error and the design specification. For example, a polysilicon shape can be divided into transistor zones and conductor zones, a shift at the transistor channel boundary edge has a direct impact on circuit performance while a same amount of shift at the conductor edge might have no any impact to circuit performance.

Figure 7:
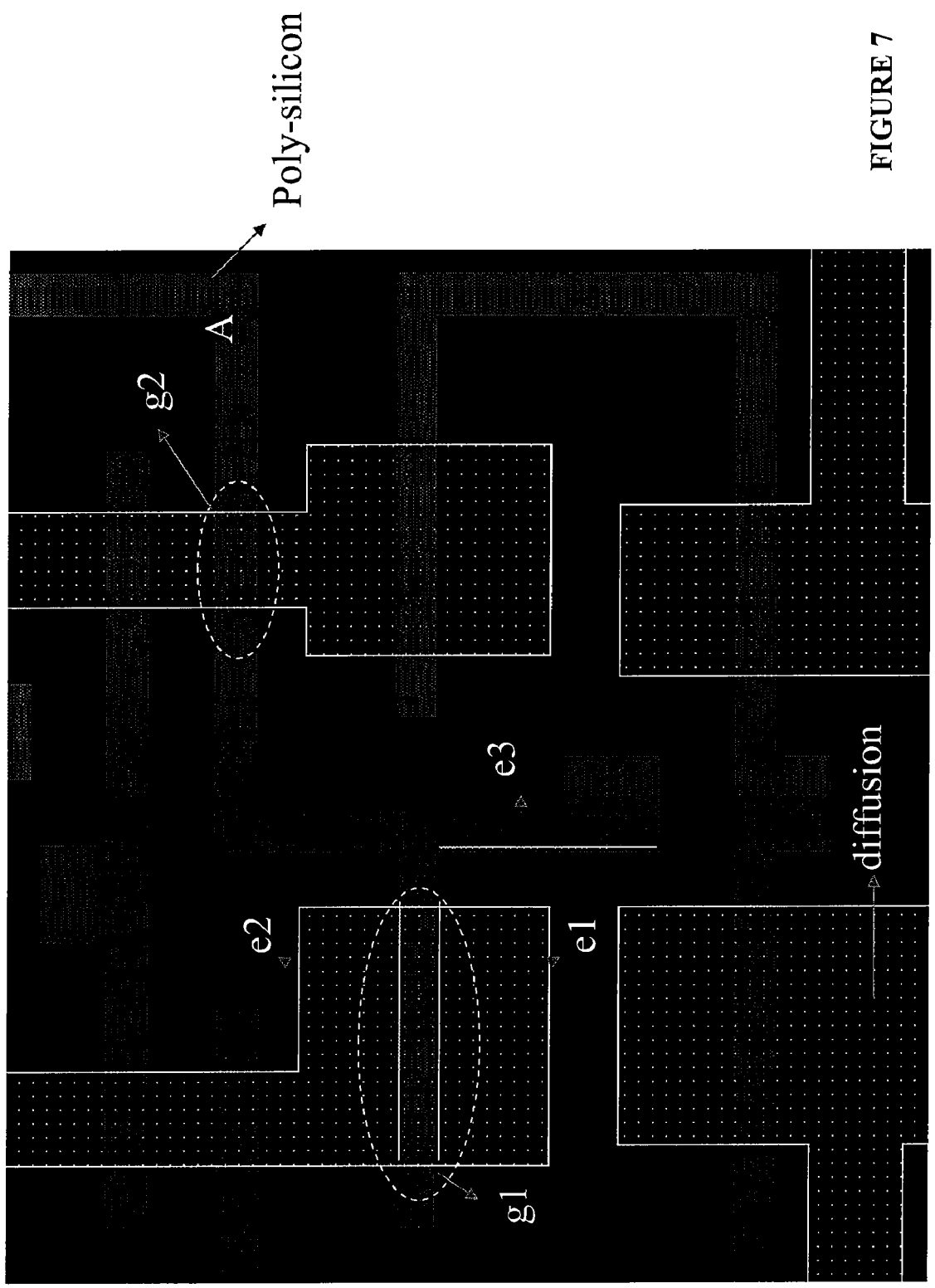
FIG. 7 shows a layout with polysilicon and diffusion.

FIG. 7 shows a small piece of layout consisting of layer polysilicon (grey filled) and layer diffusion (dash-line filled). The shape A is a polysilicon shape. It contains two transistor zones: g1 and g2 (where polysilicon and diffusion overlap), and the rest of the shape A acts as a conductor. Edges e1 and e2 are two bounding edges of the g1. Edge e3 is an edge of conductor zone. A shift on e1 and/or e1 changes the transistor performance while a shift on e3 has little impact to the design.

According to an aspect of the invention, the method simulates and checks only meaningful structures in a layout design specified by users. A meaningful structure is most likely a circuit elements, such as a transistor gate channel, a contact landing zone, a conductor zone, and so forth. For example, in FIG. 7, g1 and g2 can be viewed as two transistor structures made up of shape on layer polysilicon and shape on layer diffusion.

A structure consists of one or more shapes, on one layer or multiple layers. A structure is also referred to as a pattern in this discussion. To check a structure is to check certain critical dimension of the structure. Each type of structure has its own critical dimension (CD) or critical dimensions.

Figure 8:
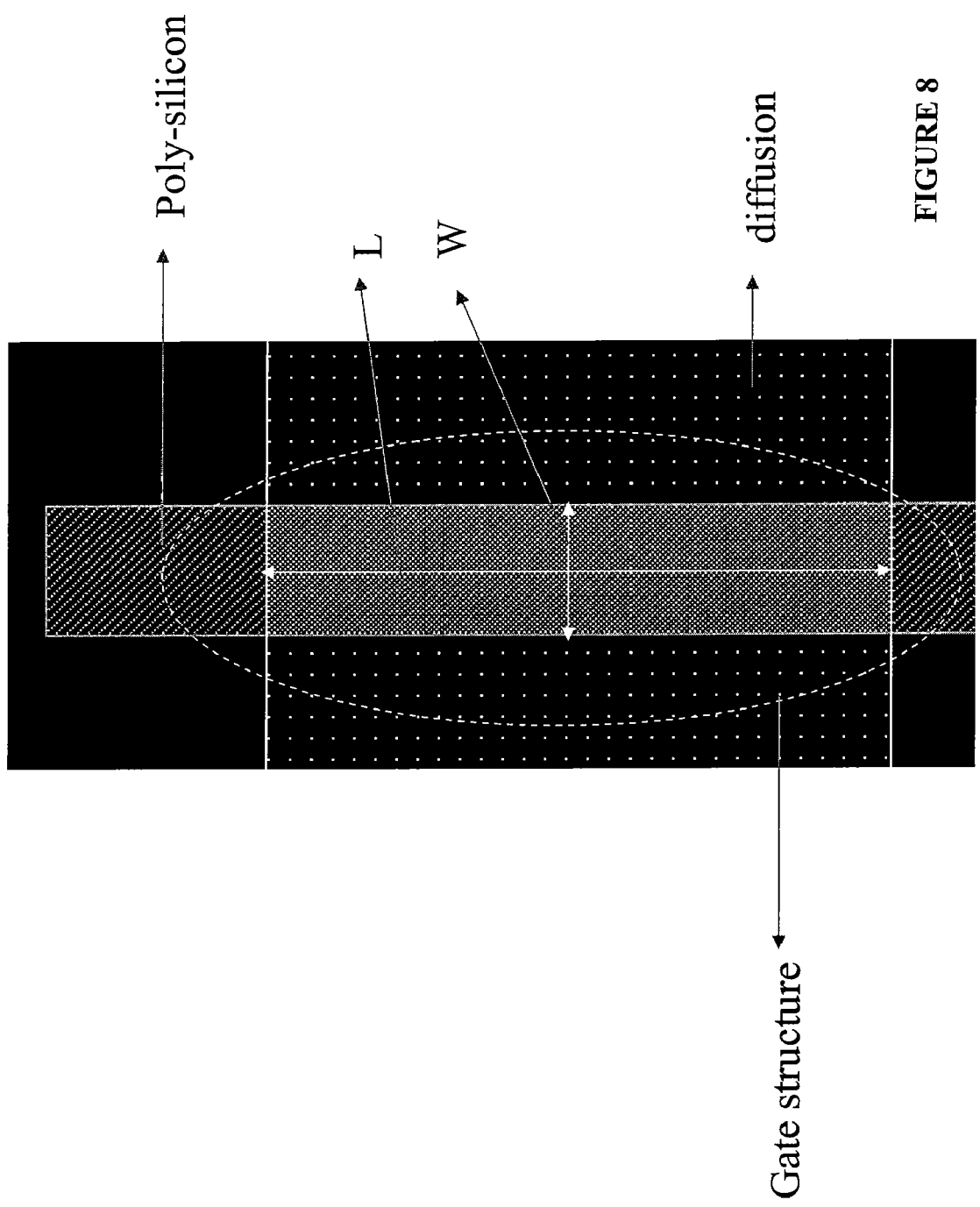
FIG. 8 shows a transistor gate structure and its critical dimension.
Figure 9:
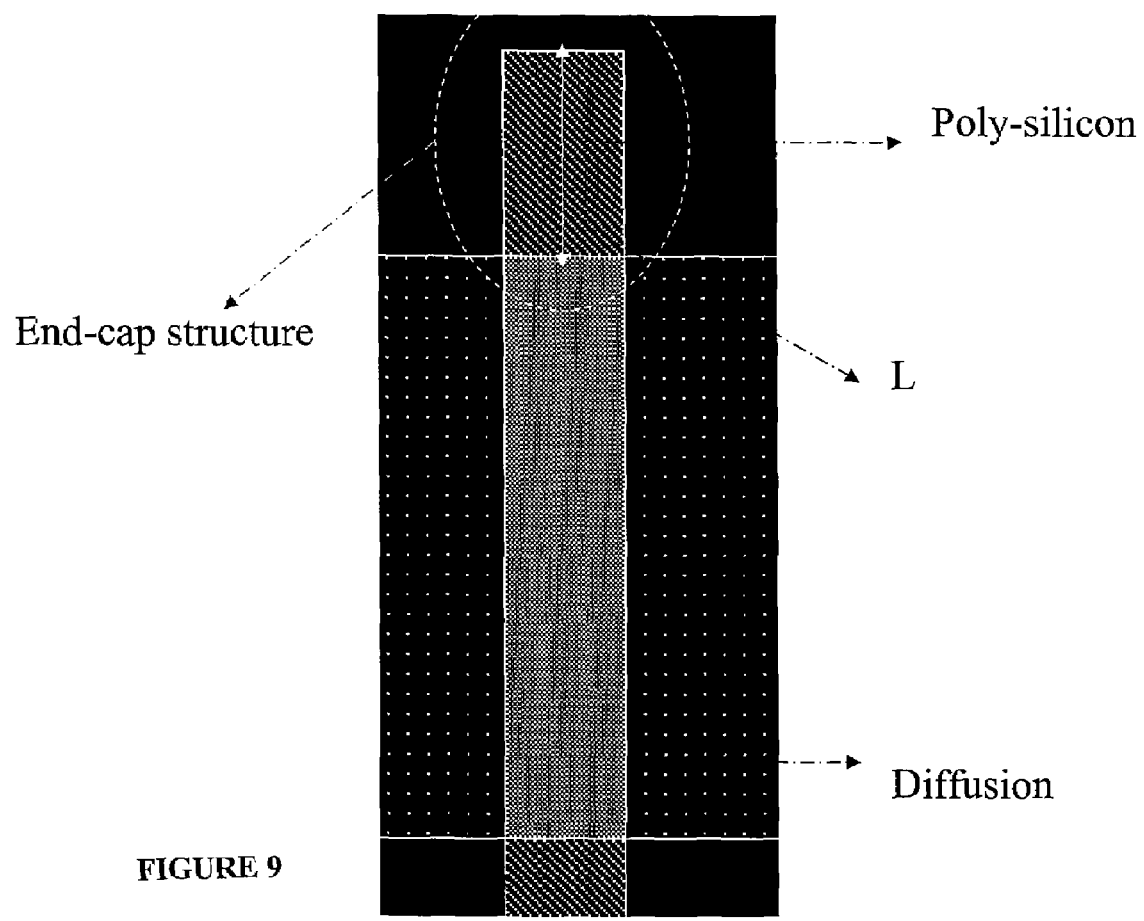
FIG. 9 shows a transistor end-cap structure and its critical dimension.
Figure 10:
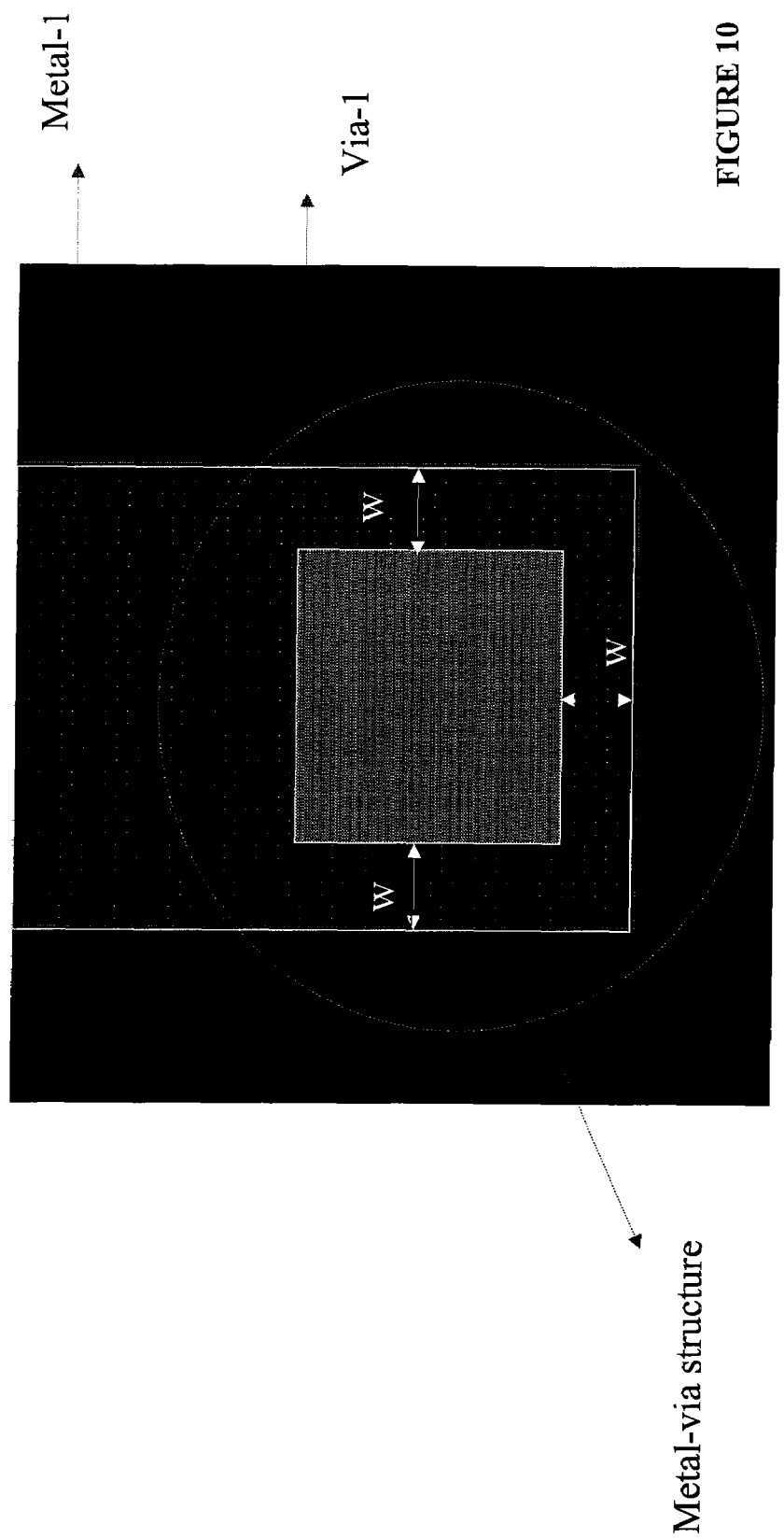
FIG. 10 shows a via-metal structure and its critical dimension.
Figure 11:
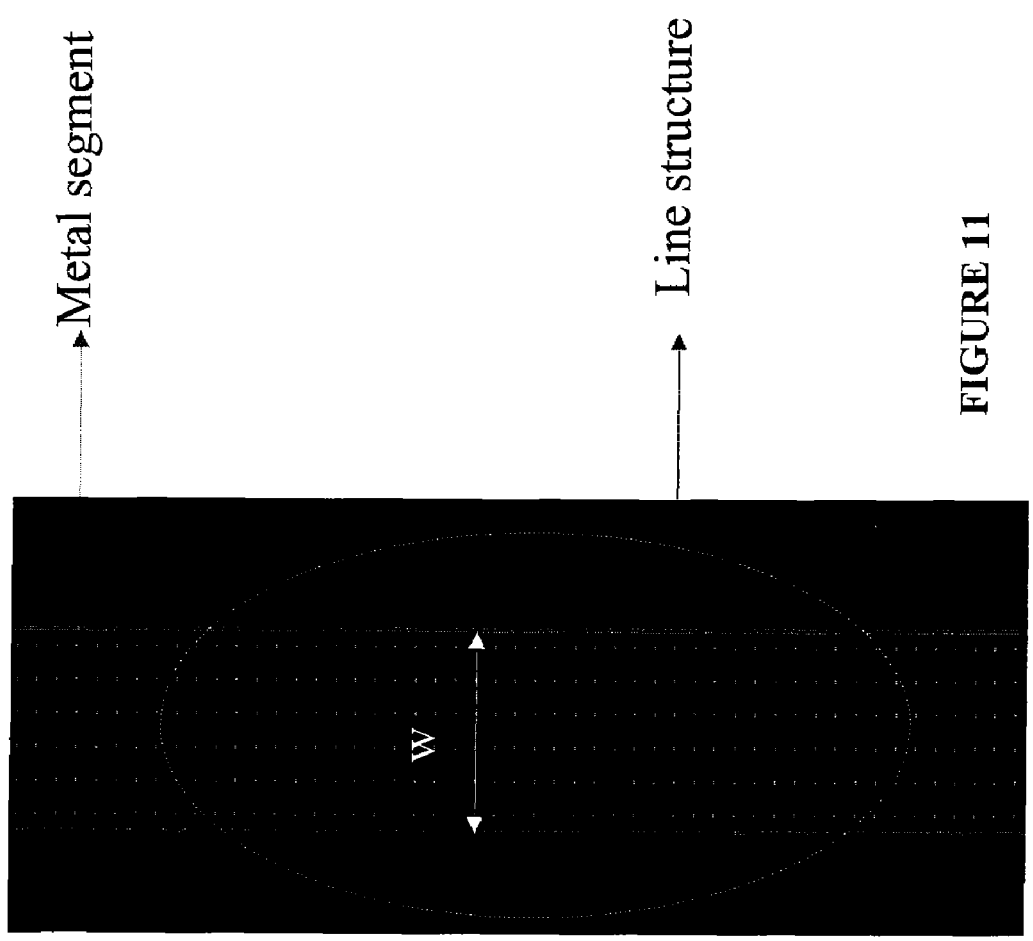
FIG. 11 shows a line segment and its critical dimension.
Figure 12:
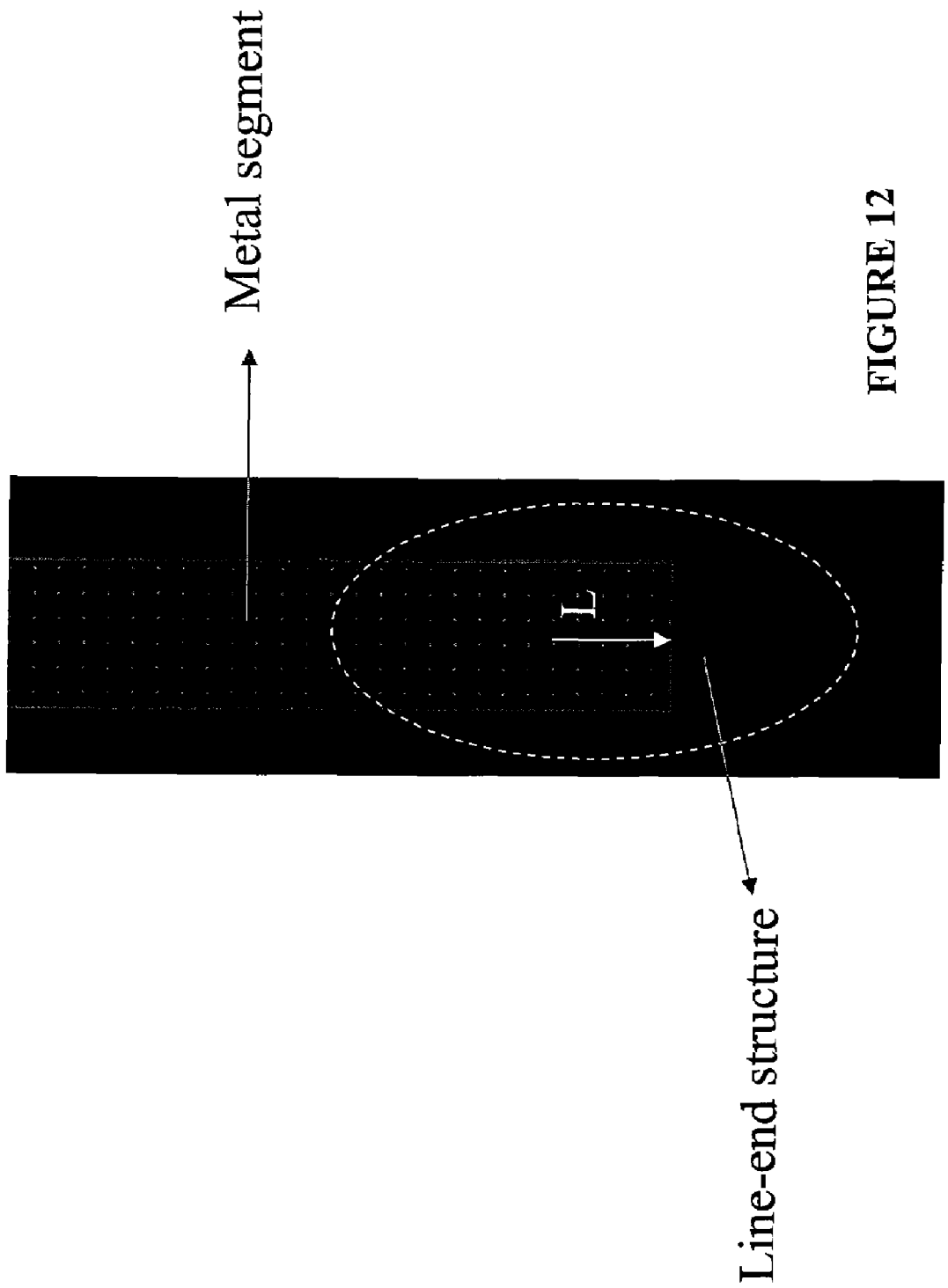
FIG. 12 shows a line-end structure and its critical dimension.
Figure 13:
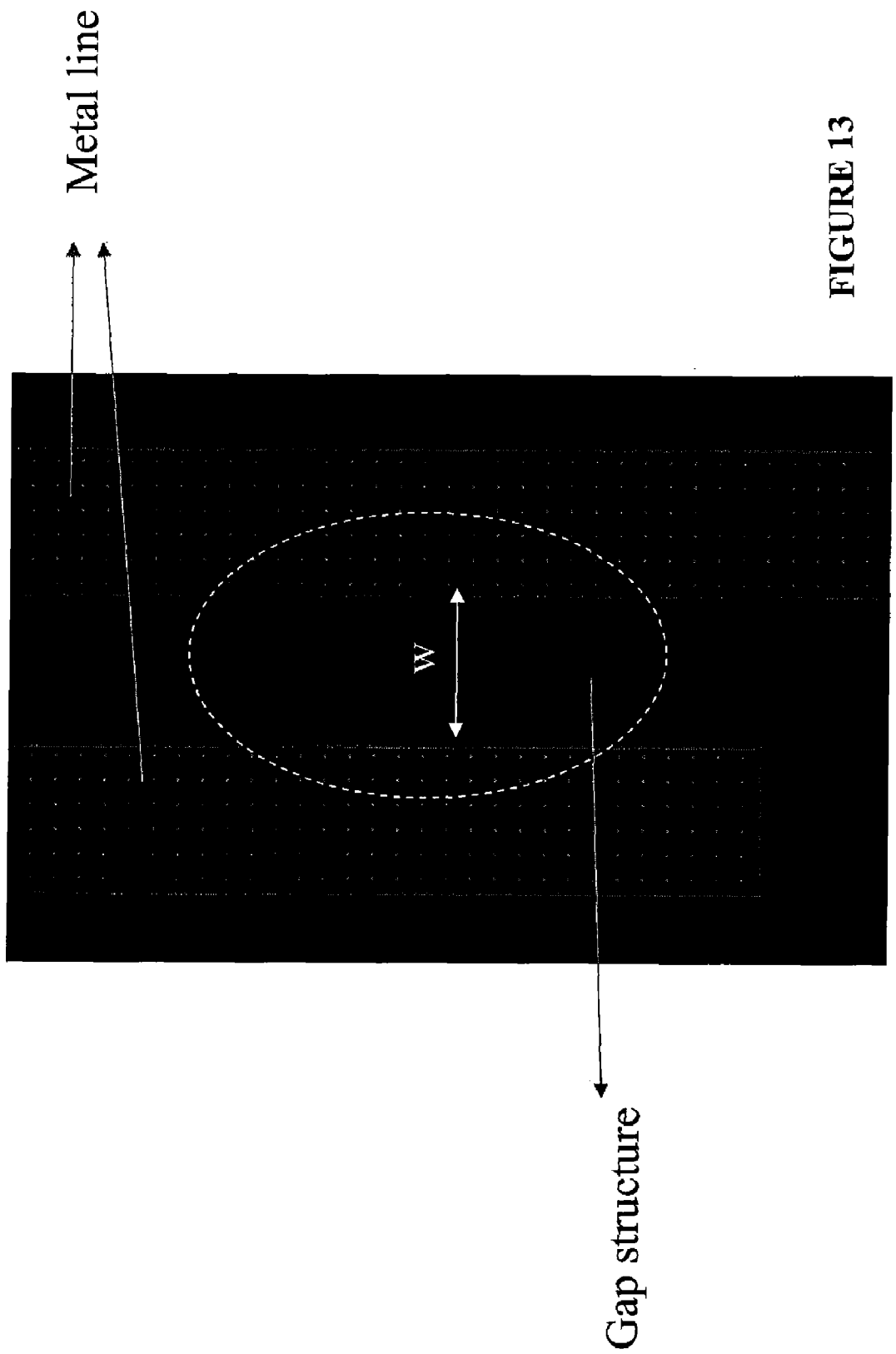
FIG. 13 shows a gap structure and its critical dimension.

The most popular structures are: transistor gate, transistor end-cap, line, line-end, via/contact and gap. FIG. 8 shows a transistor gate structure. Its critical dimension is gate length (L) and gate width (W). FIG. 9 shows a transistor end-cap structure. Its critical dimension is its length (L). FIG. 10 shows a via-metal (similar for contact) structure. Its critical dimension is the metal over via enclosure width (W). FIG. 11 shows a line segment. The critical dimension is the line width (W). FIG. 12 shows a line-end structure. Its critical dimension is the line-end shortening distance (L). FIG. 13 shows a gap structure. The critical dimension is the width (W). Two shapes can be on same layer or different layers. There may be other structures than those mentioned in this application and these would be handled similarly.

Note that the structure extraction is executed on pre-OPC data. Pre-OPC layout data is well organized hierarchically, while the post-OPC data is much more flattened. Typically a post-OPC data has a size more than 10 times larger than its pre-OPC equivalence. The edge-based method mentioned above usually operates on post-OPC data.

To checks just the critical dimension of a the targeted pattern drastically reduces the effort of image simulation during the optical proximity correction data check. Furthermore, an adaptive critical dimension search technique is used. The details of this method of invention is described as follows. It checks the targeted structures one type at a time. For each structure type, it extracts the structures and sorts the structures according to their drawn critical dimension measurement. Then the structures of same size are checked together. Since most structures occur repeatedly across a design, the number of different structures are typically quite limited.

Given a set of structures of same size an adaptive search technique is used to check their critical dimensions. For the first few structures in the group, a comprehensive image simulation of the structure is conducted for its critical dimension search, that is, the critical dimension search range is wide at the beginning. As the process steps through the repeated structures, the image distortion pattern can be learned and used to adjust the critical dimension search range. Therefore the effort of image simulation is reduced gradually. This is the so called adaptive search technique.

Consequently, the method of the invention executes much faster than a traditional edge-based approach for the time consuming silicon image simulation is conducted selectively on targeted known structures rather complete image simulation.

On the other hand, the method reports the specific layout structure deformation that can be easily related to circuit failure or poor performance. Another advantage of the method of invention is that the identified defect patterns are readily linked to pre-OPC data which can guide layout designers to correct the layout structures and/or avoid similar layout structures in newer designs.

In step 420, the method analyzes the defect report from step 415, and identifies problematic patterns and cells. Typically after inspecting the optical proximity correction C data, there are a large number of potential problems or weak points that are flagged. Step 420 filters the defect data so that a user can more easily view problem areas that contain more critical defects. The data may be synthesized by, among other categories, cell and pattern. In an embodiment, the invention includes a pattern recognition engine to identify repeating errors in the same or slightly different pattern. The synthesis tool organizes the data, permits a user to graphically view and zoom into a defect area and perform detailed image simulation of layout structure.

First, patterns for all the problem spots are identified. Then a pattern recognition procedure identifies the unique patterns. Usually the number of unique patterns is quite limited. The report of unique patterns guides users to correct the pre-mature design rules for better yield.

Also there is a cell extraction routine which traces and reports the distribution of the problem structures among cells in the pre-OPC database. A design is in most cases hierarchically created. It contains cells and features. And a cell contains subcells and features, and so on. A design itself is a cell, a top cell. This cell extraction function provides users valuable information about how and where the defects come from in the view of design hierarchy.

Usually step 415 runs in batch mode while other steps run in an interactive mode. Batch mode refers processing a group of checking or other commands in a single run without user involvement. Interactive mode refers to continual interactive involvement by a user for operations to act.

Figure 5:
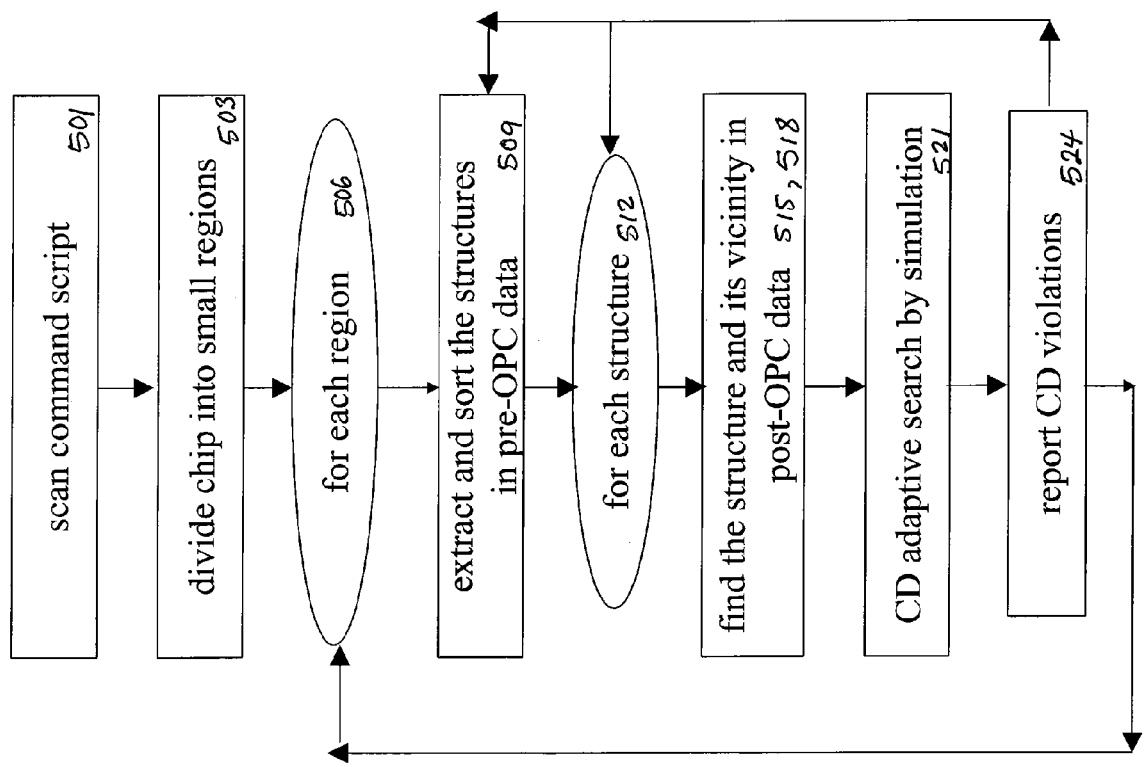
FIG. 5 shows an inspection flow diagram.

FIG. 5 shows a more detailed flow diagram for inspecting the structures of the integrated circuit design, which is step 415 in FIG. 4.

In step 501, the method read in users' control file (or put as command script) about where and what is needed to be checked. In an embodiment, the method of the present invention is structure (pattern) centric. Users can target all or special layout patterns in an inspection session. Given a type of structure users can further classify the targets by the critical dimension measurement of the structures and set different wafer image specification.

An example of such a command script is as follows:

---

CMD
    GATE_LENGTH L(0,0.15) V(−10%, 10%)
        check for all the transistor gate structures which gate channel length
        is less or equal than 0.15 micron and report any structure as defect
        if its printed channel length is reduced or enlarged by over 10%.
    GATELENGTH_UNIFORM L(0,0.15) V(0, 0.02)
        check for all the transistor gate structures which gate channel length
        is less or equal than 0.15 micron and report any structure as defect
        if the difference (as a result of shape distortion) of its
        printed channel length at maximum and that at minimum is over 0.02
        micron.
    ENDCAP_LENGTH L(0,0.2) V(−0.02, +0.03)
        check for all the transistor end-cap structures which length
        is less or equal than 0.2 micron and report any structure as defect
        if its printed length is reduced by over 0.02 micron or extended
        by over 0.03 micron.
    BREAK 6 W(0.12, 0.18) V(−0.01, +0.01)
        check for potential line break (open circuit) on layer 6 (say, layer
        Meteal-1). any line segment structure with a width in between 0.12

-continued

```
 micron and 0.18 micron is checked and report as a defect if its
   printed
   line width is changed by over 0.01 micron.
 BRIDGE 6 W(0, 0.15) V(0.08,)
   check for potential touch (circuit short) among shapes on layer 6
   (say, layer Metal-1). any space (gap) at 0.15 micron or below
   is checked and report as a defect if its printed gap size is
   less than or equal to 0.08 micron.
 VIASHORT 6 7 W(0, 0.15) V(0.1,)
   check via-metal structure for potential touch (circuit short).
   Here via is on layer 7 and metal-1 is on layer 6.
   any via located within 0.15 micron of a metal-1 edge will be
   checked and report as a defect structure if the printed image of two is
   within 0.1 micron close.
 ENCLOSE 6 7 0.005
   check via-metal structure for via enclosure by metal. Here via is on
   layer 7 and metal-1 is on layer 6.
   any via not enclosed by at least 0.005 micron is reported as a defect
     structure.
ENDCMD
```

In step 503, the method divides an integrated circuit or portion of an integrated circuit into smaller regions and checks regions one by one. This divide and conquer method is used to allow handling of the ever increasing complexity of design. One technique to divide the chip into smaller regions is to separate the chip into squares of about 400 microns each. Another technique is to divide the chip in half multiple times, until each portion is about 400 microns. A portion size of 400 microns is provided as merely an example, and any size may be selected as a portion size. For example, a portion size may be 100, 200, 300, or 400 or more microns. The portion size is not necessarily square and may be a rectangle or polygon shape. Furthermore, any other arbitrary technique of dividing a chip into smaller portions may be used.

In step 506, each of the regions is considered until the all the regions of interest are considered. All the regions together may be an entire integrated circuit. Steps 509, 512, 515, 518, 521, 524 are repeated.

In step 509, inspecting structures are extracted from pre-OPC data based on users' control file. For example, a user may desire to inspect the transistor end-cap structure. The end-cap structures extraction can be done by performing a Boolean SUB operation to subtract the shapes on diffusion layer from the shapes on polysilicon layer in the checking region and pick and end-caps from the results. The extracted structures are then sorted according to their drawn critical dimension measurement.

In step 512, each of the structures is considered until all structures are considered. Steps 515, 518, 521, and 524 are repeated.

In step 518, the method locates the structure in the corresponding post-OPC data and the area of its vicinity within a radius of size ambit (a given process modeling parameter).

Figure 14:
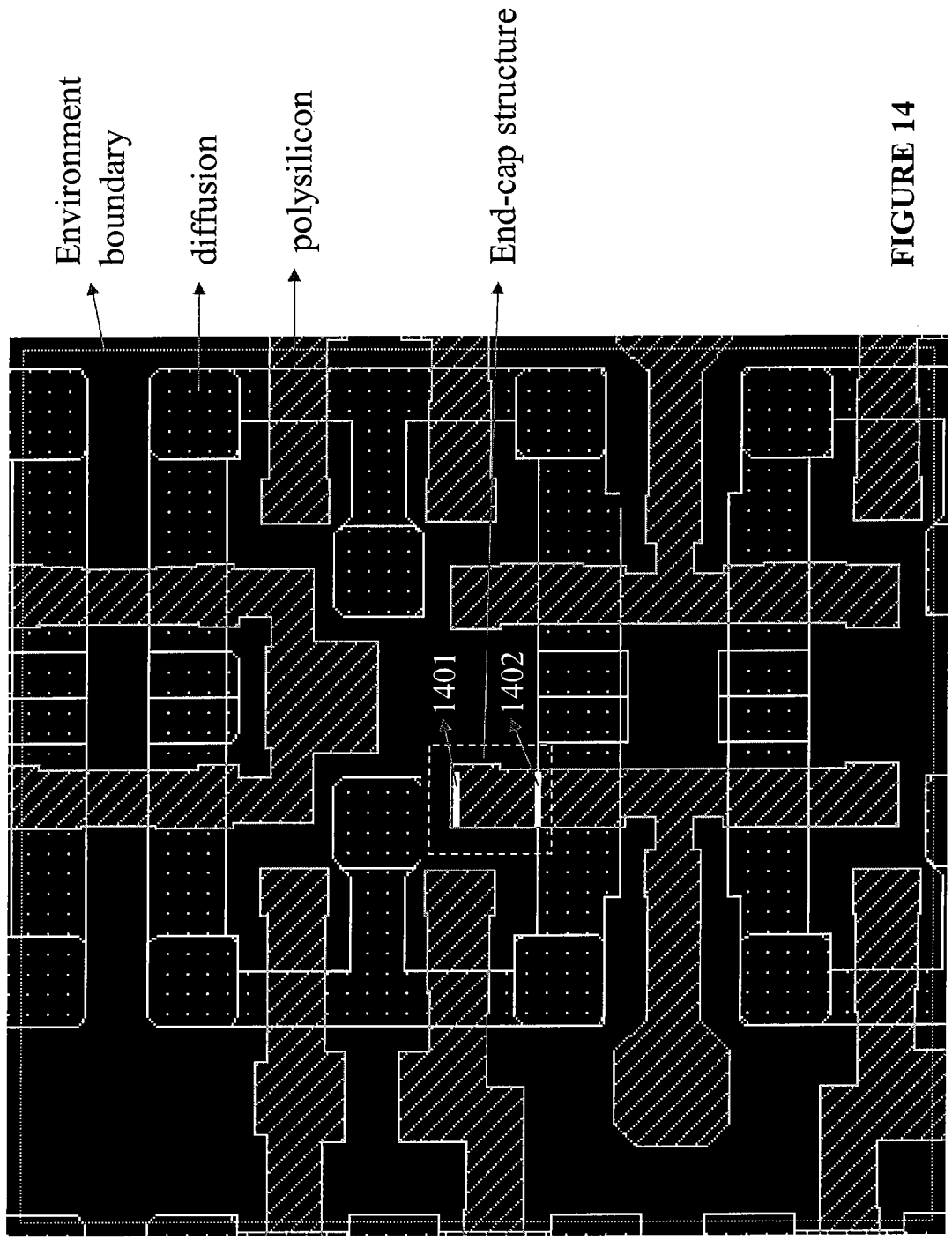
FIG. 14 shows an end-cap structure and its simulation environment

FIG. 14 shows a end-cap structure and its vicinity environment on polysilicon layer (line filled) and diffusion layer (dot filled). The environment of a structure consists of those shapes which make contribution to form the image of the structure. The image simulation for the structure should consider all the shapes in the environment.

In step 521, the method search the critical dimensions of the structure using the adaptive search technique described above.

Take the end-cap structure as an example, its critical dimension is its line-end length. To measure the length we just need to locate its two ends in wafer image. In FIG. 14, the targeted end-cap has two ends, end 1401 on polysilicon layer and the end 1402 is on diffusion layer.

Take the end 1401 as an example. To locate its image position, all the shapes in the environment are collected for the image pixel intensity simulation nearby the end. And thus find the image of the end. Then the image shift of and end is recorded together with its environment structure. Later on for another end-cap structure with same drawn size and similar environment, the method assume the image shift is about the same as the previous check and narrow the image search within a much smaller range just for final position adjustment.

In step 524, the method reports violation if the critical dimension of a structure does not meet its design specification.

Table 1 below provides an example of a specific pseudocode implementation of the method in FIG. 5.

TABLE 1

Defect Inspection Pseudocode

Figure 6:
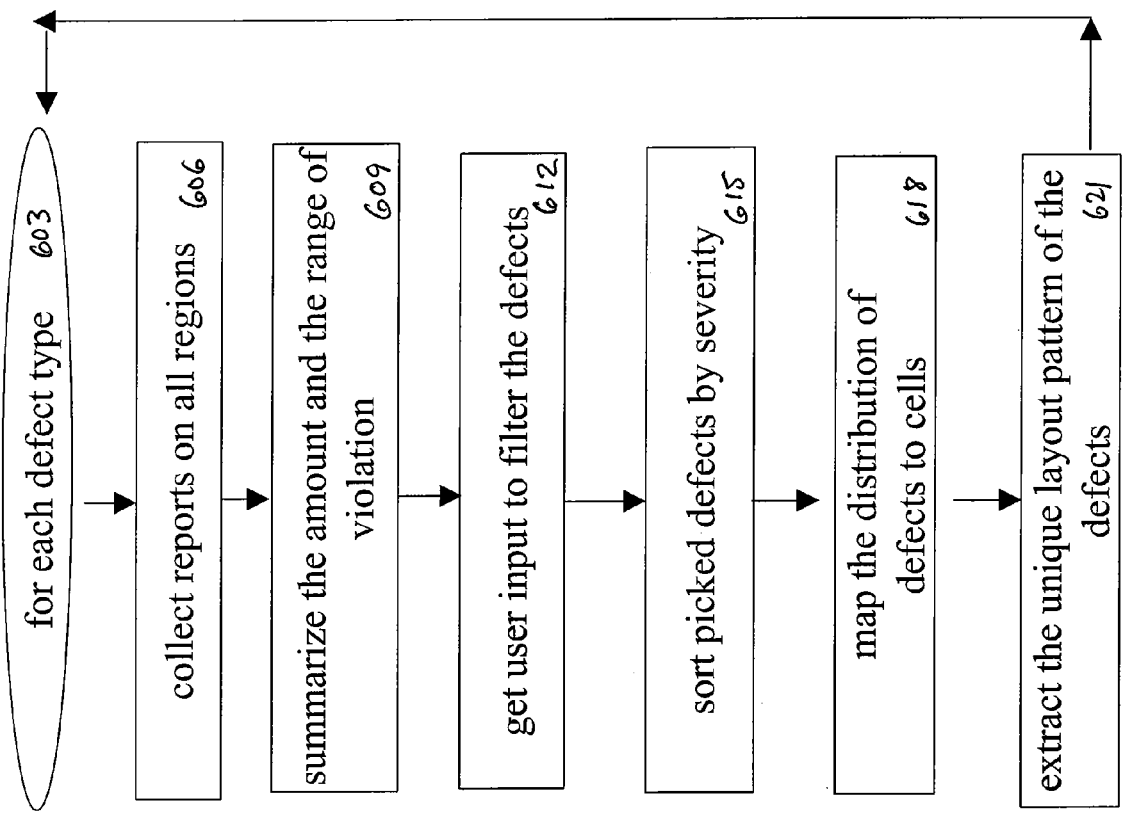
FIG. 6 shows a defect synthesis flow diagram.

Since the chip design is getting very complicated the inspection process runs in a region by region basis throughout the whole chip. The inspection routine works as follows:
  0. parse users command script
  1. divide chip into small regions
  2. for each region
      a. extract out the targeted inspecting layout structures and sort them into groups according to their drawn CD measurement, such that the structures of same CD measurement are in a same group.
      b. for each group of the targeted structures
          i. extract its equivalent in post-OPC layout and the vicinity
          ii. search the image CD of the targeted structure
          iii. check the image CD against the specification of the structure and report any violation as a defect
      c. classify defect report and output the result FIG. 6 shows a more detailed flow diagram for analyzing the defect report, which may be referred to as defect synthesis and is shown as step 420 in FIG. 4.

In step 603, for each defect category, steps 606, 609, 612, 615, 618, and 621 are repeated.

In step 606, the method collects reports on all regions.

Figure 15:
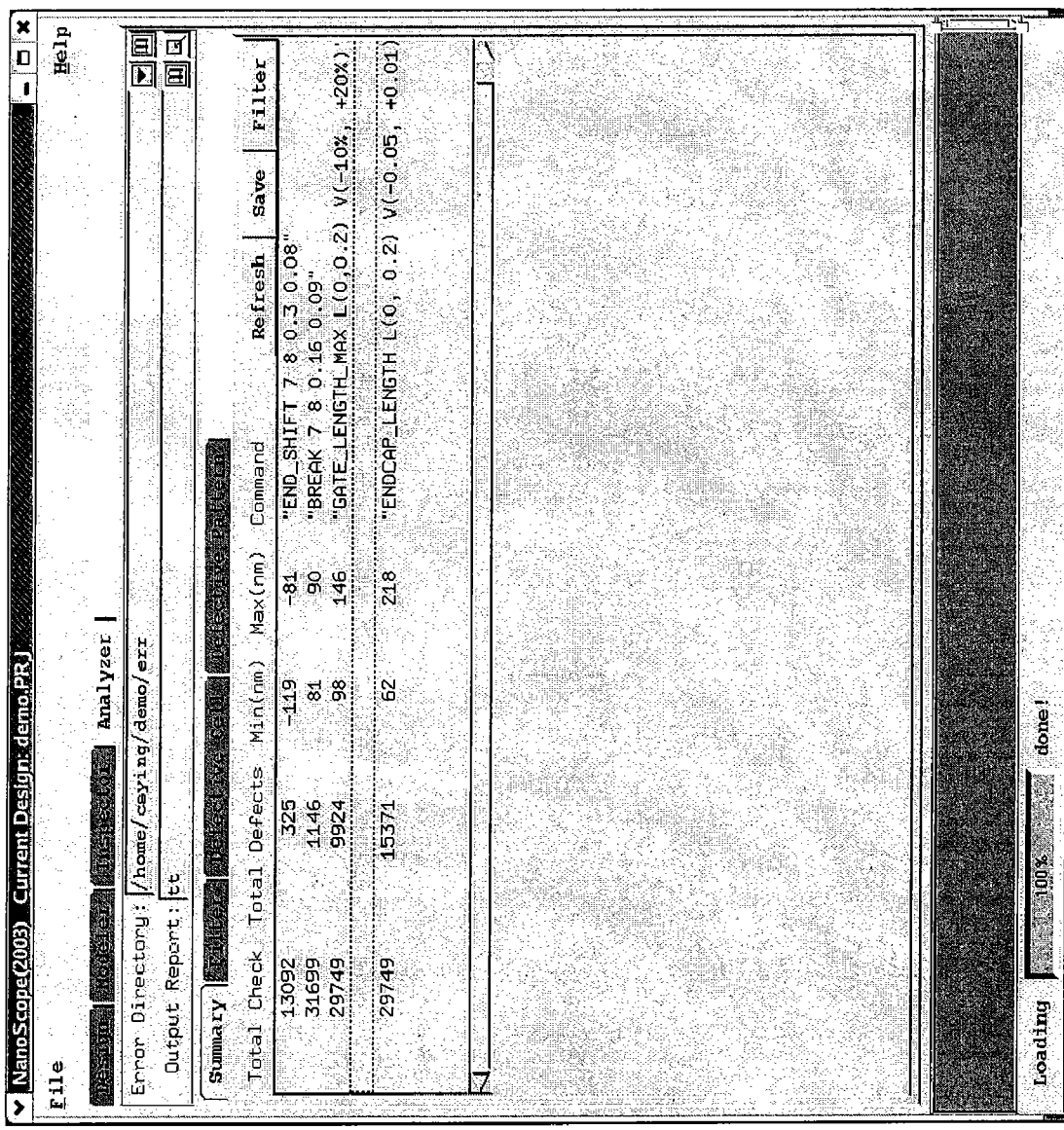
FIG. 15 is a sample user interface of a summary report page.

In step 609, the method summarizes the amount and range of violation corresponding to each checking commands. FIG. 15 is a sample user interface of the Nanoscope software showing a summary report page. It lists the summary of the results of five checking commands.

In step 612, the method gets user input to filter the reported defects. Users may instruct the program to report a wide range of critical dimension measurement in the inspection command script. In this step users can filter the defect by different critical dimension measurement range.

Figure 16:
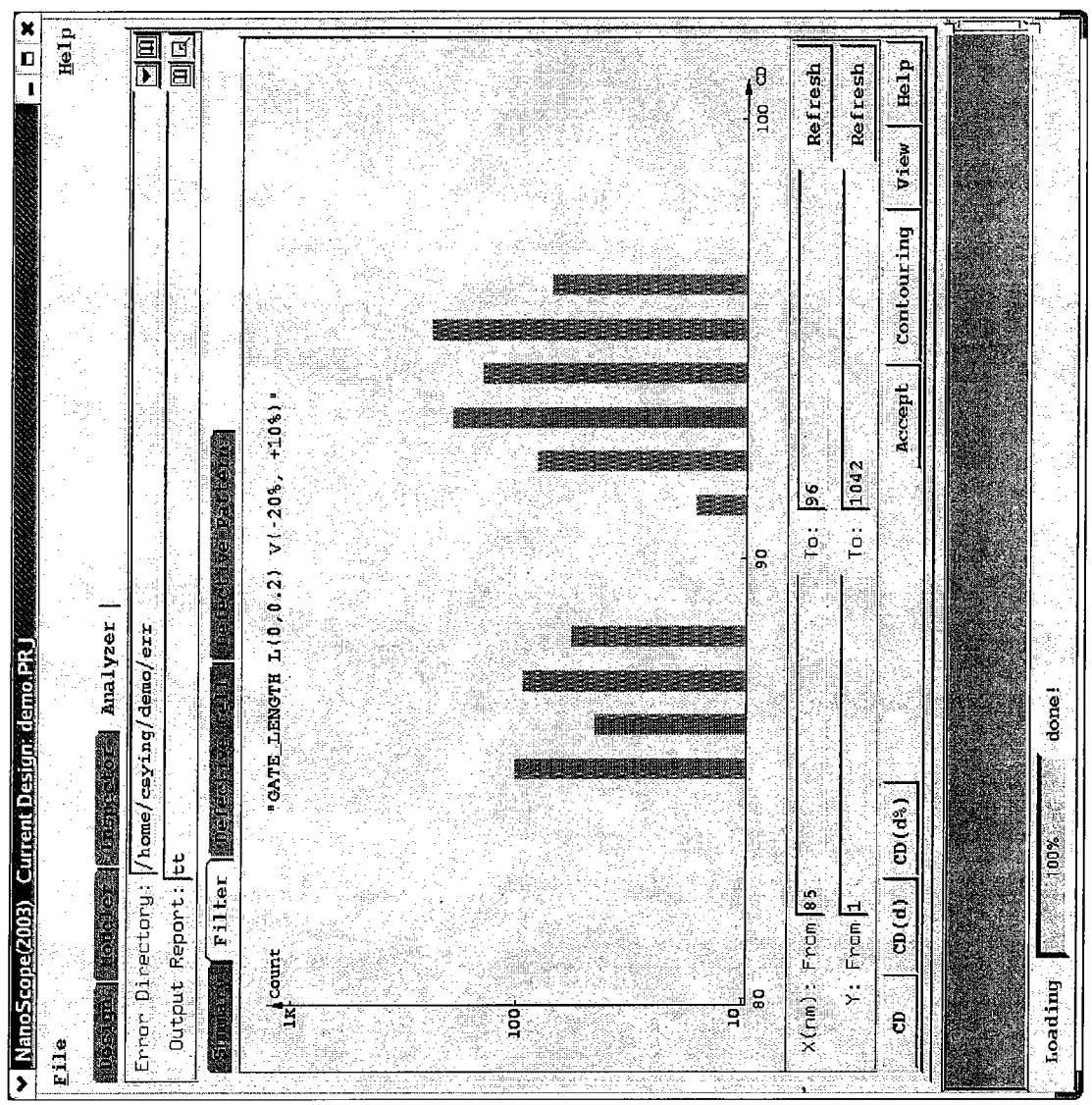
FIG. 16 is a sample user interface of a defect filtering page.

FIG. 16 is a sample user interface of Nanoscope showing a defect filtering page. It shows the distribution of the reported 1042 gate channel length shortening defects ranging from 85 nanometers to 96 nanometers.

In step 615, the method sorts the user's picked or selected defects by severity. For example, a typical 130 nanometer process design may target its minimum gate length at 120 nanometers in average and an acceptable range from 110 nanometers to 130 nanometers. Users can instruct the tool to check the gate length of all the gates with a minimum draw length and report the gates with a length less than 120 nanometers. The inspection results may include a large amount of gates. The tool sorts the reported gate length in an increasing order. In this step users can choose a range of gate length and let the tool to show the total amount of gates and the distribution. Very likely users want to those gates with a length less than 110 nanometers if there is any.

In step 618, the method maps the distribution of defects to cells. Given a set of defects users selected in previous step, the method can further trace out in which cells these defects locate in the design hierarchy in pre-OPC data. It is quite possible that the defects come from a few cells which include some special shapes. This gives users a direction to correct the defects and improve the yields.

Figure 17:
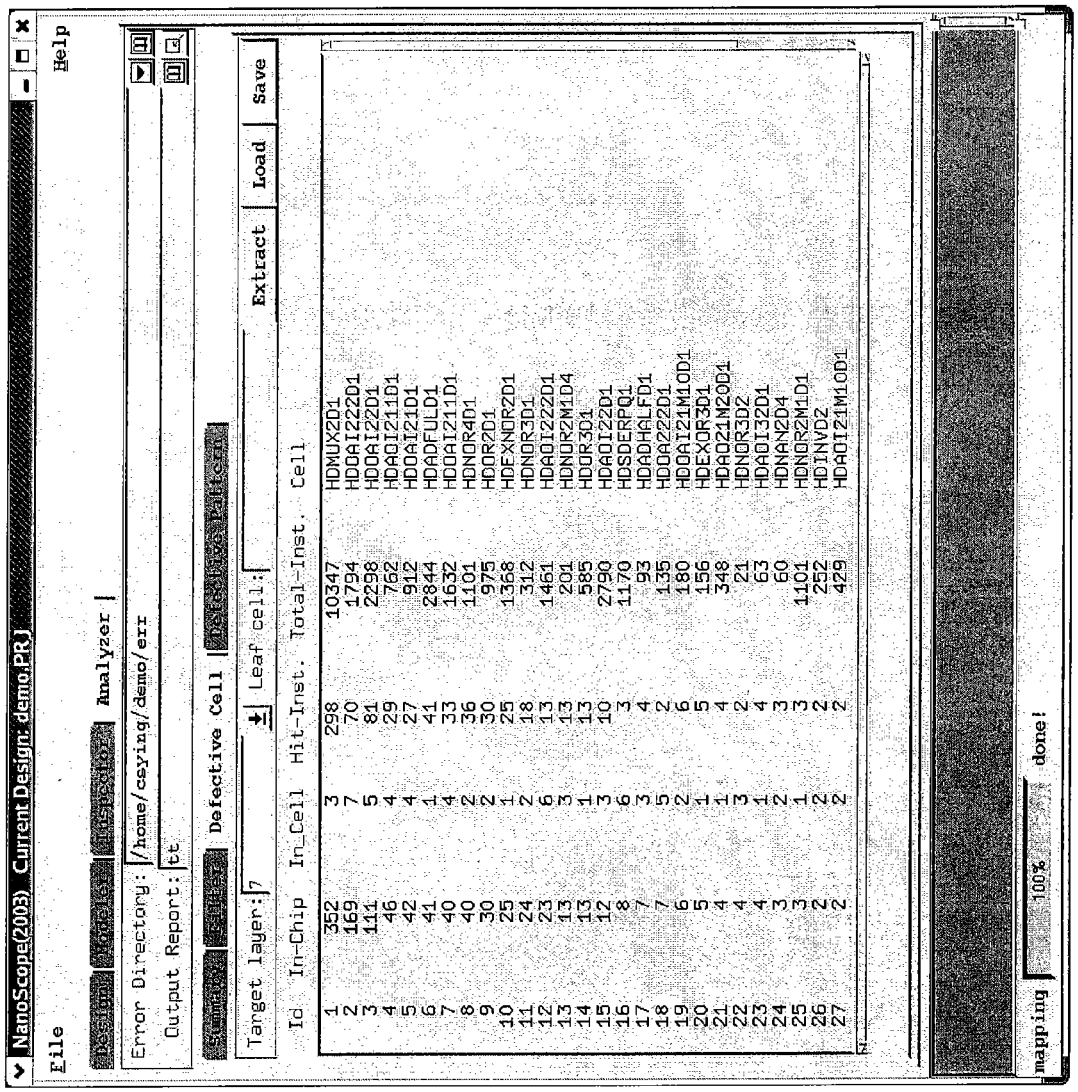
FIG. 17 is a sample user interface of a cell distribution map page.

FIG. 17 is a sample user interface of Nanoscope showing a cell distribution map page. It shows the distribution of 1042 channel length shortening defects among 33 cells.

In step 621, the method extracts layout for each defect and identifies all the different layout patterns.

A pattern is a set of polygons chopped off from an area which is centered at the problem spot and extended by the size of "ambit" horizontally and vertically. First patterns for all the problem spots are identified. Then a pattern recognition procedure identifies the unique patterns. Usually the amount of unique patterns is quite limited. The report of unique patterns guides users to correct the pre-mature design rules for better yield.

Figure 18:
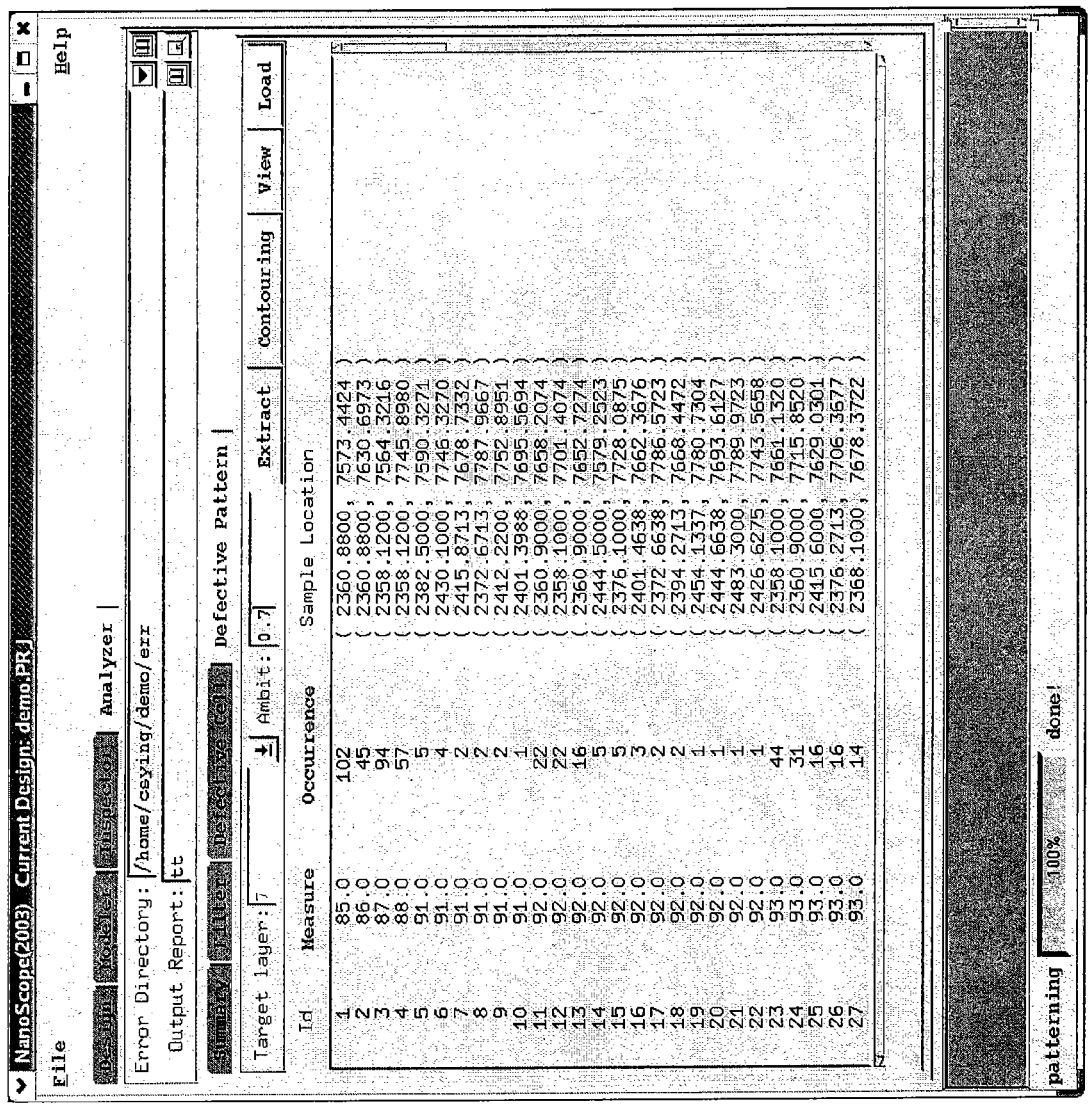
FIG. 18 is a sample user interface of a pattern distribution map page.
Figure 19:
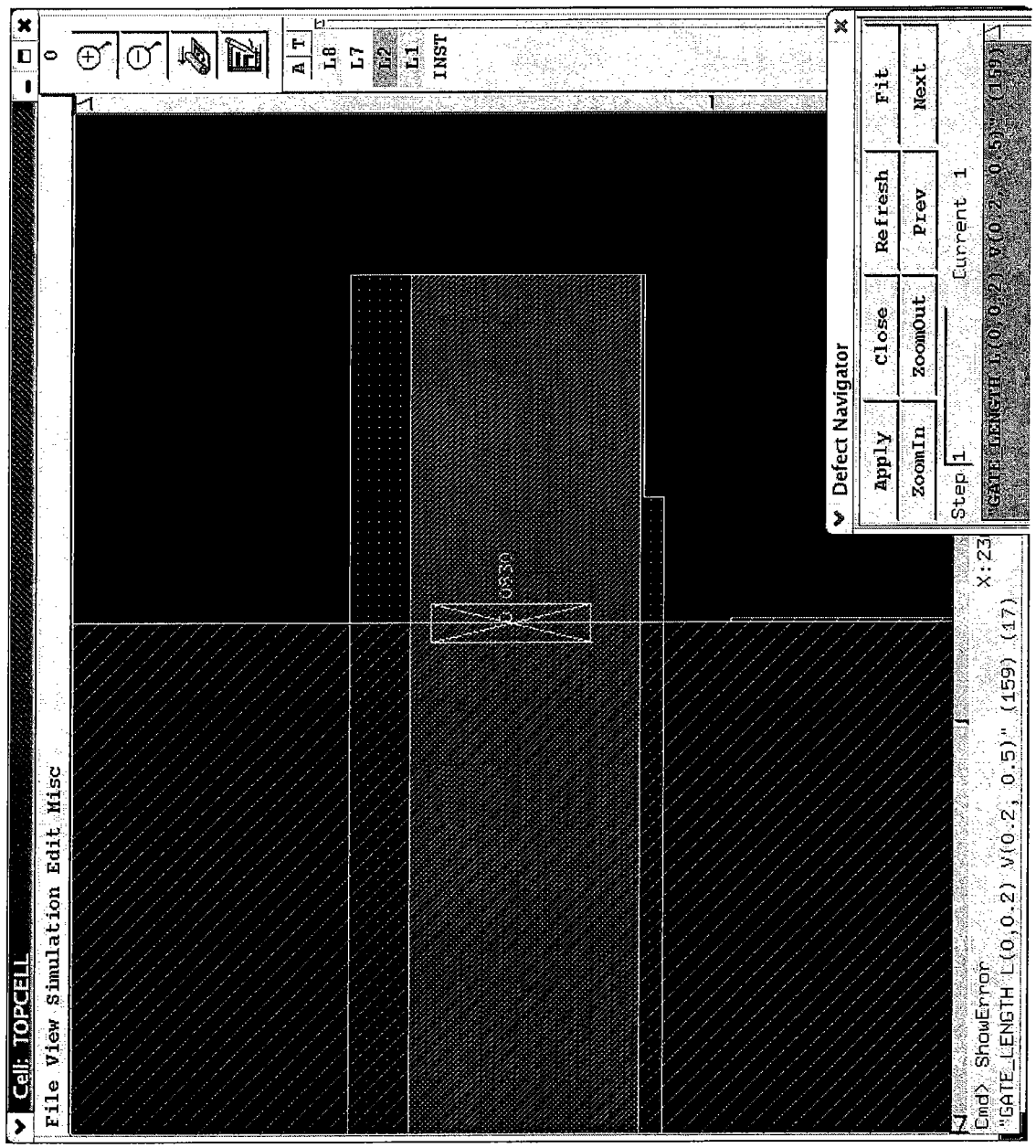
FIG. 19 is a sample user interface of a defect pattern display.

FIG. 18 is a sample user interface of NanoScope showing a pattern distribution map page. It shows the distribution of the reported 1042 channel length shortening defects among 133 unique patterns. Users can step through the pattern list for a close look. FIG. 19 shows a sample gate length shortening defect pattern with a measurement of 0.093 micron.

Table 2 below provides an example of a specific pseudocode implementation of the method in FIG. 6.

TABLE 2

Defect Synthesis Pseudo-Code 1. collect defect report on all regions for each defect type
2. for each defect type
   a. do a summary to indicate the total amount of defect in the category and the range of violation
   b. allow user to filter the defect to be reviewed
   c. sort defect to be reviewed according to its severity
   d. trace the belonging cell of each defect and create a cell distribution
   e. extract the layout pattern for each defect and identify all the unique patterns This detailed description of the invention has been presented for the purpose of illustration and description. It is not intended to be exhaustive or to limit the invention to the precise form described. Many modifications and variations are possible in light of this detailed description. The embodiments were chosen and described in order to best explain the principles of the invention and its practical applications. Others skilled in the art will recognize that various modifications can be made in order to best utilize and practice the invention for a particular application. The scope of the invention is defined by the following claims.

What is claimed is:

1. A method for checking optical proximity correction data, the method comprising:
   (a) dividing a chip region into at least first and second regions;
   (b) selecting the first region from the divided regions;
   (c) providing a first layout database of an integrated circuit design corresponding to the first region, wherein the first layout database is obtained before optical proximity correction treatment;
   (d) providing a second layout database of the integrated circuit design corresponding to the first region, wherein the second database is obtained after optical proximity correction treatment;
   (e) finding a location of a first structure in the first layout database;
   (f) simulating a resulting layout output for the first structure using the second layout database;
   (g) measuring a first critical dimension of the first structure from the resulting layout output for the first structure;
   (h) comparing the first critical dimension of the first structure to a drawn dimension of the first structure from the first database;
   (i) flagging the first structure in the second database if the first critical dimension is less than the first drawn dimension of the first database;
   (j) repeating the steps (a) to (i) to generate a defect report at least on the first and second regions;
   (k) analyzing the defect report to identify one or more problematic patterns; and
   (l) identifying unique patterns from the one or more problematic patterns.

2. The method of claim 1 wherein the step (i) is replaced by flagging the first structure in the second database if the first dimension is less than the first drawn dimension plus a tolerance value in the first database.

3. The method of claim 2 wherein the tolerance value is defined by a user.

4. The method of claim 1 wherein the first and second layout databases in GDSII format.

5. The method of claim 1 wherein the first structure is at least one of a transistor gate, transistor end-cap line, line-end, via and gap, or contact and gap.

6. The method of claim 1 wherein the step of finding a location of a first structure in the first layout database is performed using pattern recognition.

7. The method of claim 1 wherein when the first structure is a transistor gate, the first critical dimension is a gate length.

8. The method of claim 1 wherein the first structure is a transistor gate, the first critical dimension is a gate width.

9. The method of claim 1 further comprising:
   (m) building a model of a process, to be used to fabricated the integrated circuit design, and wherein the step of simulating a resulting layout output for the first structure using the second layout database is performed using this model of the process.

10. The method of claim 1 wherein the step of simulating a resulting layout output for the first structure using the second layout database comprises consulting a look-up table.

11. A method for generating a circuit design, the method comprising:
    providing a first layout database of an integrated circuit design, wherein the first layout database is obtained before optical proximity correction treatment;
    providing a second layout database of the integrated circuit design, wherein the second database is obtained after optical proximity correction treatment;
    finding a location of a first structure in the first layout database;
    finding a first structure in the second layout database based on its location in the first layout database;

simulating a resulting layout output for the first structure using the second layout database;

measuring a first critical dimension of the first structure from the resulting layout output for the first structure;

comparing the first critical dimension of the first structure to a drawn dimension of the first structure from the first database;

flagging the first structure in the first database if the first critical dimension is less than the first drawn dimension in the first database to generate a defect report, analyzing the defect report to identify one or more problematic patters; and identifying unique patterns from the one or more problematic patterns.

12. The method of claim 11 further comprising:

flagging the first structure in the second database if the first critical dimension is less than the first drawn dimension in the first database.

* * * * *